(12) United States Patent
Nakata

(10) Patent No.: US 6,770,557 B2
(45) Date of Patent: Aug. 3, 2004

(54) SEMICONDUCTOR DEVICE AND METHOD OF FABRICATING THE SAME

(75) Inventor: Yoji Nakata, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/131,478

(22) Filed: Apr. 25, 2002

(65) Prior Publication Data

US 2003/0008498 A1 Jan. 9, 2003

(30) Foreign Application Priority Data

Jul. 5, 2001 (JP) .......................................... 2001-204202

(51) Int. Cl.[7] .......................................... H01L 21/4763
(52) U.S. Cl. .................... 438/627; 436/633; 436/637
(58) Field of Search ........................... 438/396, 253, 438/241, 626, 631, 632, 637, 645, 627, 633

(56) References Cited

U.S. PATENT DOCUMENTS

| | | | | |
|---|---|---|---|---|
| 5,262,354 A | * | 11/1993 | Cote et al. ..................... | 216/18 |
| 5,304,510 A | * | 4/1994 | Suguro et al. ............... | 438/624 |
| 5,689,140 A | * | 11/1997 | Shoda ......................... | 257/774 |
| 5,872,053 A | * | 2/1999 | Smith ......................... | 438/626 |
| 5,985,751 A | * | 11/1999 | Koyama ..................... | 438/637 |
| 6,060,386 A | * | 5/2000 | Givens ....................... | 438/626 |
| 6,191,027 B1 | * | 2/2001 | Omura ........................ | 438/627 |
| 6,211,085 B1 | * | 4/2001 | Liu .............................. | 438/687 |
| 6,319,821 B1 | * | 11/2001 | Liu et al. .................... | 438/636 |
| 6,410,424 B1 | * | 6/2002 | Tsai et al. ................... | 438/637 |
| 6,576,527 B2 | * | 6/2003 | Nakamura .................. | 438/396 |

FOREIGN PATENT DOCUMENTS

| | | |
|---|---|---|
| JP | 6-310605 | 11/1994 |
| KR | 95-30312 | 11/1995 |

* cited by examiner

Primary Examiner—Michael S. Lebentritt
(74) Attorney, Agent, or Firm—McDermott Will & Emery LLP

(57) ABSTRACT

In order to provide a method of fabricating a semiconductor device improved to be capable of attaining high reliability of wiring, a plug material is deposited on a semiconductor substrate to fill up a contact hole. The plug material is etched back thereby forming a plug in the contact hole. The surface of a cavity defined in the plug is covered with an insulator film. A metal wire is formed on the interlayer isolation film to be in contact with the plug.

6 Claims, 6 Drawing Sheets

SEMICONDUCTOR DEVICE AND METHOD OF FABRICATING THE SAME

BACKGROUND OF THE INVENTION

1. Field of the Invention

The present invention generally relates to a method of fabricating a semiconductor device, and more specifically, it relates to a method of fabricating a semiconductor device improved to be capable of attaining high reliability in junction between a plug part and a wire part. The present invention also relates to a semiconductor device obtained by such a method.

2. Description of the Prior Art

FIG. 9 is a sectional view showing an ideally formed conventional dynamic random access memory.

A capacitor 11 is formed on a semiconductor substrate 50. A metal wire 5 and lower conductor films 6 are connected with each other through plugs 3 embedded in contact holes 10. The height of the capacitor 11 tends to increase due to high integration. Consequently, the contact holes 10 tend to increasingly deepen. The contact holes 10 are 0.3 μm to 0.4 μm in diameter, for example, and 1.5 μm to 2 μm in depth.

A fabrication process for a conventional semiconductor element such as the dynamic random access memory is described. In order to form contactors for the metal wire 5 and the lower conductor films 6 by the tungsten plugs 3 or the like, the contact holes 10 are first formed in an interlayer isolation film. Thereafter tungsten employed as the plug material is deposited and totally dryly etched back so that unnecessary tungsten part is removed, thereby forming the plugs 3. Thereafter the metal wire 5 is formed on the plugs 3 as such.

If the dynamic random access memory is not ideally formed as shown in FIG. 9 but any contact hole 10 is filled up with a plug material 2 as shown in FIG. 10, however, a cavity 20 may be defined in the plug material 2.

When the plug material 2 having such a cavity 20 is etched back, the cavity 20 remains in the plug 3 as shown in FIG. 11.

Referring to FIG. 12, when a portion located on such a cavity 20 is not covered with the metal wire 5, i.e., when coverage is defective, a chemical solution (e.g., an organic solvent) employed in a wet step (a development step, a resist removal step or the like) for forming the metal wire 5 may penetrate into the cavity 20 to corrode the plug 3. This problem remarkably arises when the metal wire 5 is misregistered.

The metal wire 5 and the plug 3 may not come into contact with each other due to such corrosion, leading to reduction of reliability of wiring. Further, the plug 3 may dissolve in the chemical solution and disappear, to reduce reliability of wiring.

SUMMARY OF THE INVENTION

The present invention has been proposed in order to solve the aforementioned problems, and an object thereof is to provide a method of fabricating a semiconductor device improved to be capable of attaining excellent contact between a metal wire and a plug thereby improving reliability of wiring.

Another object of the present invention is to provide a method of fabricating a semiconductor device improved to cause no disappearance of a plug.

Still another object of the present invention is to provide a semiconductor device improved in reliability of wiring, obtained by such a method.

In the method of fabricating a semiconductor device according to the present invention, an interlayer isolation film is first formed on a semiconductor substrate. A contact hole is formed in the aforementioned interlayer isolation film. A plug material is formed on the aforementioned semiconductor substrate to fill up the aforementioned contact hole. The aforementioned plug material is etched back thereby forming a plug in the aforementioned contact hole. The surface of a cavity defined in the aforementioned plug is covered with an insulator film. A metal wire is formed on the aforementioned interlayer isolation film to be in contact with the aforementioned plug.

According to a preferred mode of the present invention, the step of covering the surface of the cavity defined in the aforementioned plug with the insulator film includes a step of completely filling up the cavity formed in the aforementioned plug with the insulator film.

Alternatively, the step of covering the surface of the cavity defined in the aforementioned plug with the insulator film includes a step of covering the surface of the cavity without completely filling up the cavity formed in the aforementioned plug with the aforementioned insulator film.

The aforementioned insulator film preferably includes an SiN film.

This method is preferably applied to a method of fabricating a dynamic random access memory.

A semiconductor device according to another aspect of the present invention comprises a semiconductor substrate. An interlayer isolation film is formed on the aforementioned semiconductor substrate. A contact hole is formed in the aforementioned interlayer isolation film. A plug is formed in the aforementioned contact hole. The surface of a cavity defined in the aforementioned plug is covered with an insulator film. A metal wire is provided on the aforementioned interlayer isolation film to be in contact with the aforementioned plug.

According to a preferred mode of the present invention, the aforementioned insulator film completely fills up the aforementioned cavity.

According to another preferred mode of the present invention, the aforementioned insulator film does not completely fill up the aforementioned cavity The aforementioned insulator film preferably includes an SiN film.

This semiconductor device includes a dynamic random access memory.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
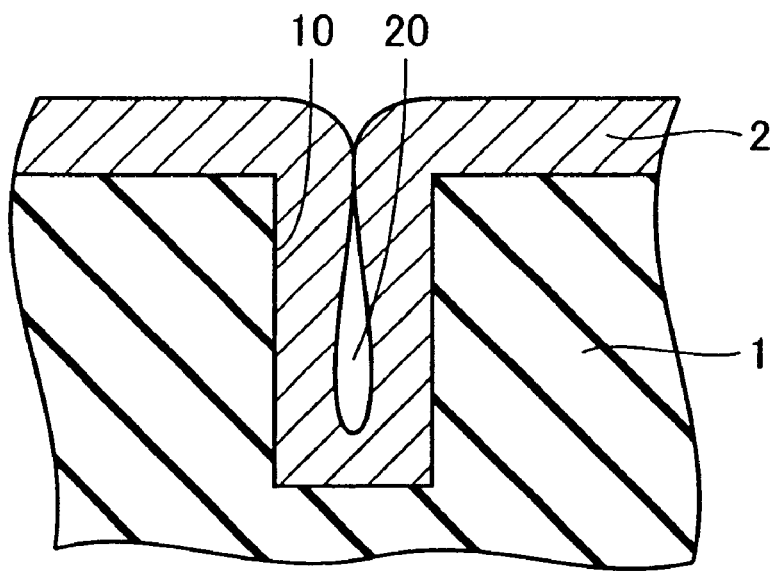
FIGS. 1 to 5 are sectional views of a semiconductor device showing first to fifth steps in a method of fabricating a semiconductor device according to a first embodiment o the present invention.

A first embodiment of the present invention relates to a method of forming a contactor for a metal wire and a lower conductive layer through the following process:

Referring to FIG. 1, a contact hole 10 is formed in an interlayer isolation film (oxide film) 1 formed on a semiconductor substrate (not shown). The contact hole 10 is employed for forming a contactor for a metal wire 5 and a lower conductor layer. A plug material 2 is deposited on the semiconductor substrate to fill up the contact hole 10. When the contact hole 10 has a high aspect ratio, a cavity 20 is defined as shown in FIG. 1.

Figure 2:
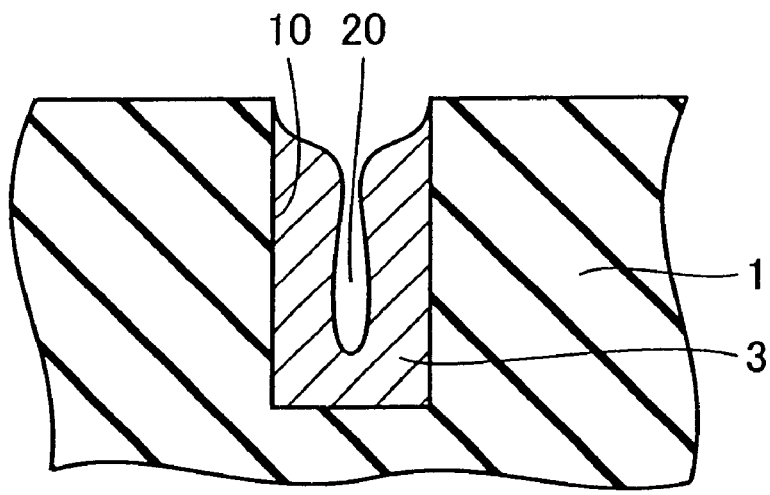

Referring to FIGS. 1 and 2, the plug material 2 is totally dryly (anisotropically) etched back, for forming a plug 3.

Figure 3:
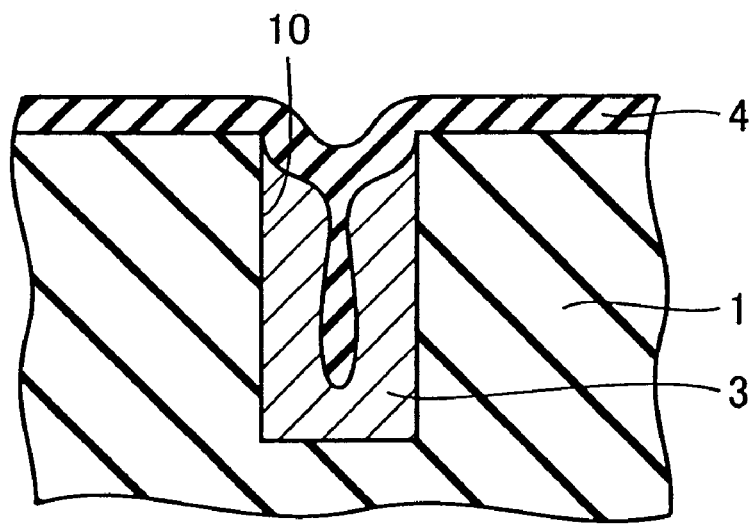

Referring to FIG. 3, an insulator film 4 is formed on the semiconductor substrate to completely fill up the cavity 20 defined in the plug 3. The insulator film 4 is preferably formed by an SiN film. While the cavity 20 may not necessarily be filled up with the insulator film 4, no conductor film can properly fill up the cavity 20.

Figure 4:
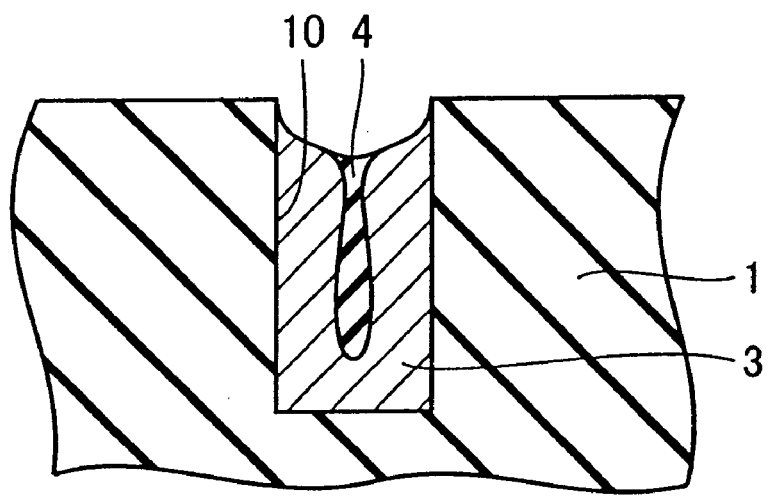

Referring to FIGS. 3 and 4, the insulator film 4 is totally etched back for filling up the cavity 20 with the insulator film 4. The thickness of the insulator film 4 and etch-back conditions therefor are so selected as to charge the cavity 20 with the insulator film 4. The thickness of the insulator film 4 is 4000 to 5000 Å, for example.

Figure 5:
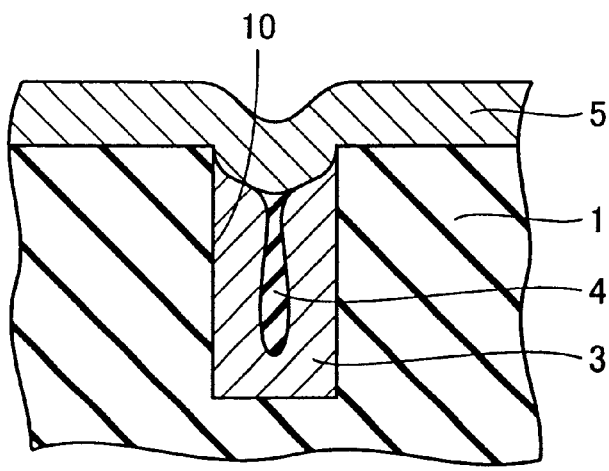

Referring to FIG. 5, the metal wire 5 is formed on the interlayer isolation film 1 to be in contact with the plug 3.

Figure 6:
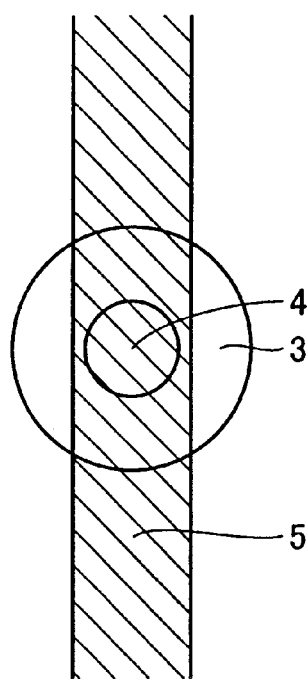
FIG. 6 is a plan view of the semiconductor device shown in FIG. 5.
Figure 7:
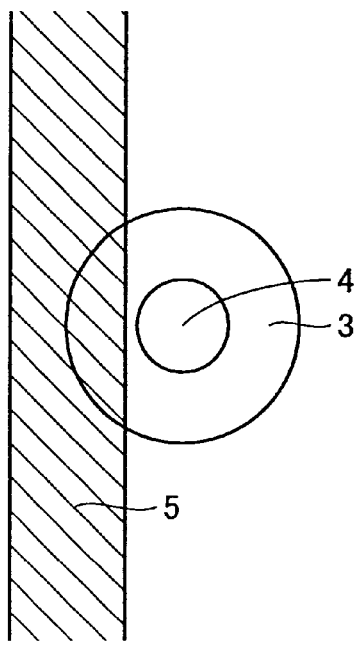
FIG. 7 is a plan view of the semiconductor device shown in FIG. 5 causing misregistration.

FIG. 6 is a plan view of the semiconductor device shown in FIG. 5. FIG. 7 is a plan view of the semiconductor device shown in FIG. 5 causing misregistration in formation of the metal wire 5. Referring to FIG. 7, the cavity 20 is filled up with the insulator film 4 also when the same is not covered with the metal wire 5, and hence no chemical solution penetrates into the cavity 20. Thus, the plug 3 is not corroded but forms a reliable contactor.

Referring again to FIG. 5, the insulator film 4 is charged in the cavity 20 thereby improving coverage of the metal wire 5 as well as reliability of wiring.

An insulating material such as an SiN film is employed as the material charged in the cavity 20 since the insulating material is hardly corroded by a chemical solution (a resist removing solution, a developer or the like) employed in a step of forming the metal wire 5 and suitably functions as the material for filling up the cavity 20.

The insulating material can alternatively be prepared from $SiO_2$, in place of SiN.

Second Embodiment

While the cavity 20 is completely charged with the insulator film 4 in the first embodiment, the present invention is not restricted to this.

Figure 8:
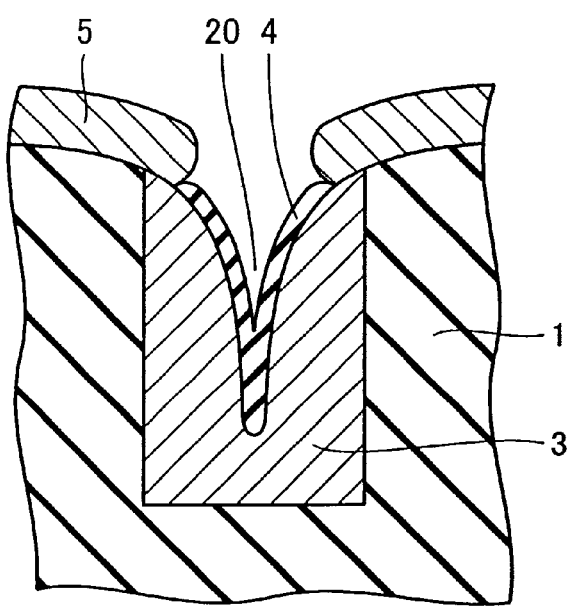
FIG. 8 is a sectional view of a semiconductor device according to a second embodiment of the present invention.
Figure 9:
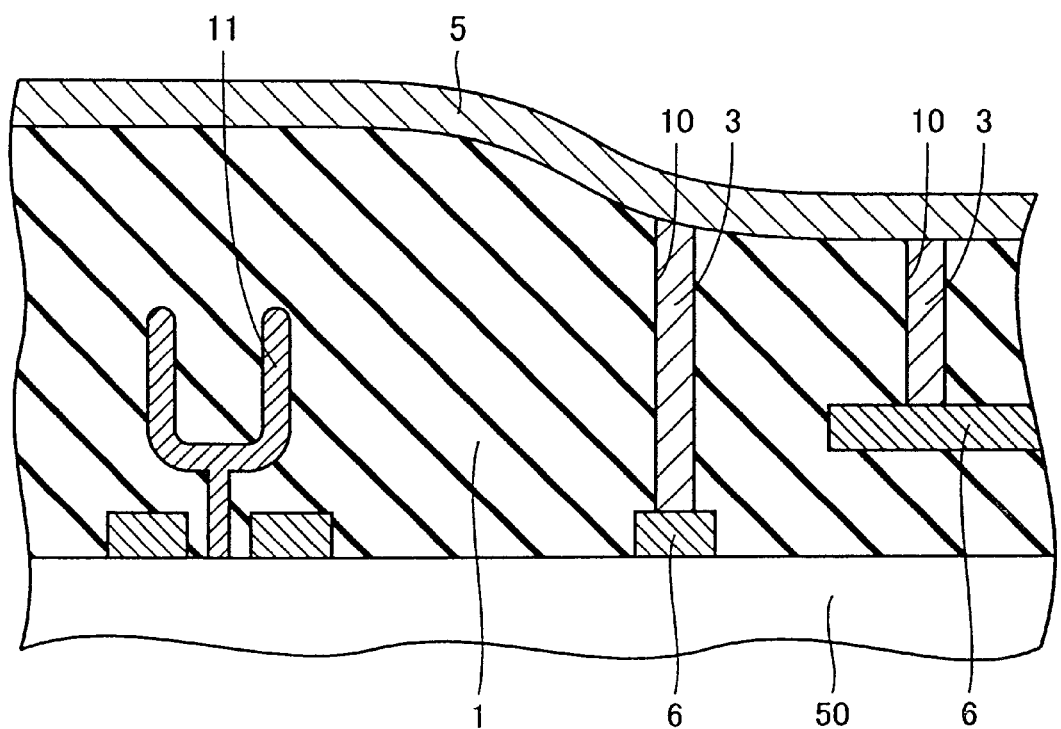
FIG. 9 is a sectional view showing an exemplary semiconductor device to which the present invention is applied.
Figure 10:
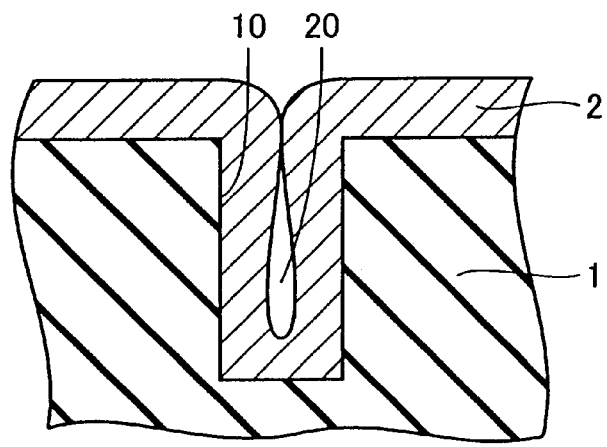
FIGS. 10 to 12 are sectional views of a semiconductor device showing first to third steps in a conventional method of fabricating a semiconductor device.
Figure 11:
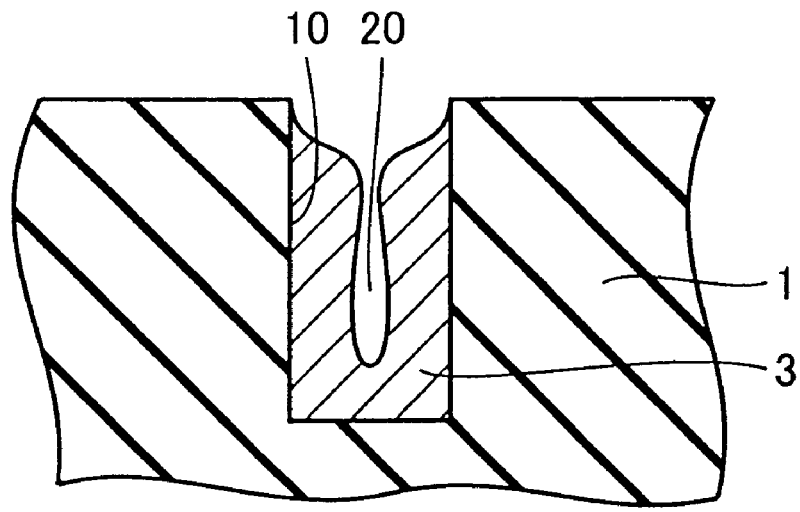
Figure 12:
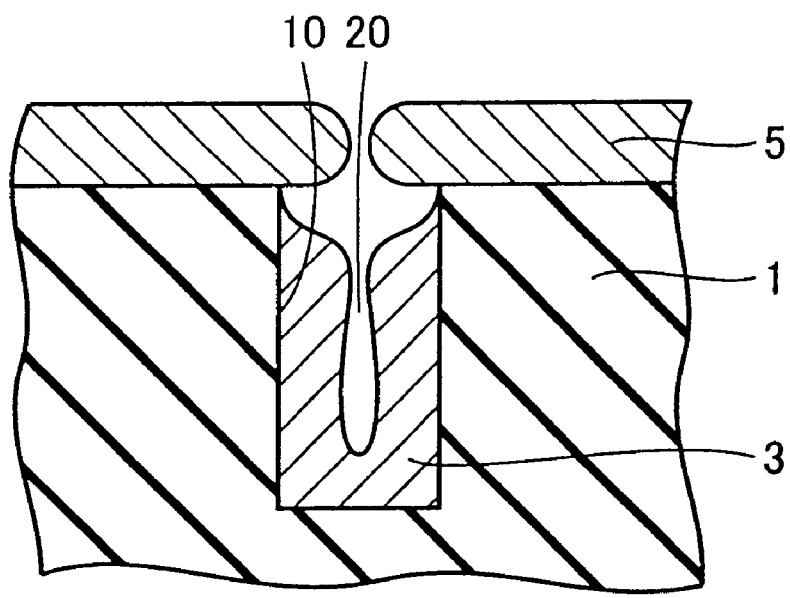

Referring to FIG. 8, the surface of a cavity 20 may be covered with an insulator film 4 so that the cavity 20 is not completely filled up with the insulator film 4. This structure also attains an effect similar to that of the first embodiment. Also when misregistration takes place and the cavity 20 is not covered with a metal wire but a chemical solution penetrates into the cavity 20, a plug 3 is not corroded since the same is protected with the insulator film 4. Thus, the plug 3 forms a reliable contactor.

According to the present invention, as hereinabove described, no chemical solution penetrates into a cavity of a plug also when the cavity is not covered with a metal wire, whereby the plug is not corroded. Thus, the plug can effectively form a reliable contactor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device comprising steps of:

forming an interlayer isolation film on a semiconductor substrate;

forming a contact hole in said interlayer isolation film;

forming a plug material on said semiconductor substrate to fill up said contact hole;

etching back said plug material thereby forming a plug in said contact hole;

covering the surface of a cavity defined in said plug with an insulator film; and forming a metal wire on said interlayer isolation film to be in contact with said plug.

2. The method of fabricating a semiconductor device according to claim 1, wherein said step of covering the surface of said cavity defined in said plug with said insulator film includes a step of completely filling up said cavity formed in said plug with said insulator film.

3. The method of fabricating a semiconductor device according to claim 1, wherein said step of covering the surface of said cavity defined in said plug with said insulator film includes a step of covering the surface of said cavity without completely filling up said cavity formed in said plug with said insulator film.

4. The method of fabricating a semiconductor device according to claim 1, wherein said insulator film includes an SiN film.

5. The method of fabricating a semiconductor device according to claim 1, applied to a method of fabricating a dynamic random access memory.

6. The method of fabricating a semiconductor device according to claim 1, wherein the step of covering the cavity defined in said plug with an insulator film comprises forming the insulator film to cover only a portion where said plug is positioned.

* * * * *